US011370872B2

(12) United States Patent
Hori et al.

(10) Patent No.: US 11,370,872 B2
(45) Date of Patent: Jun. 28, 2022

(54) COMPOSITION FOR PATTERN FORMATION, AND PATTERN-FORMING METHOD

(71) Applicant: JSR CORPORATION, Tokyo (JP)

(72) Inventors: Masafumi Hori, Tokyo (JP); Hiroyuki Komatsu, Tokyo (JP); Tomohiro Oda, Tokyo (JP); Hitoshi Osaki, Tokyo (JP); Takehiko Naruoka, Tokyo (JP)

(73) Assignee: JSR Corporation, Tokyo (JP)

( * ) Notice: Subject to any disclaimer, the term of this patent is extended or adjusted under 35 U.S.C. 154(b) by 173 days.

(21) Appl. No.: 16/240,070

(22) Filed: Jan. 4, 2019

(65) Prior Publication Data

US 2019/0135967 A1 May 9, 2019

Related U.S. Application Data

(63) Continuation of application No. PCT/JP2017/023649, filed on Jun. 27, 2017.

(30) Foreign Application Priority Data

Jul. 7, 2016 (JP) .............................. JP2016-135509

(51) Int. Cl.
*C08F 297/02* (2006.01)
*G03F 7/32* (2006.01)
*C08K 5/10* (2006.01)
*C08L 53/00* (2006.01)
*B82Y 40/00* (2011.01)
*B82Y 30/00* (2011.01)
*H01L 21/027* (2006.01)
*G03F 7/00* (2006.01)
*C08L 25/04* (2006.01)

(52) U.S. Cl.
CPC ............ *C08F 297/02* (2013.01); *B82Y 30/00* (2013.01); *B82Y 40/00* (2013.01); *C08K 5/10* (2013.01); *C08L 25/04* (2013.01); *C08L 53/00* (2013.01); *G03F 7/0002* (2013.01); *G03F 7/325* (2013.01); *H01L 21/027* (2013.01); *H01L 21/0271* (2013.01)

(58) Field of Classification Search
CPC .......... C08L 53/00; C08L 25/04; G03F 7/325; G03F 7/0002; H01L 21/0273
See application file for complete search history.

(56) References Cited

U.S. PATENT DOCUMENTS

| | | | |
|---|---|---|---|
| 6,605,229 B2 | 8/2003 | Steiner et al. | |
| 7,037,738 B2 | 5/2006 | Sugiyama et al. | |
| 2001/0024684 A1 | 9/2001 | Steiner et al. | |
| 2003/0178626 A1 | 9/2003 | Sugiyama et al. | |
| 2005/0145864 A1 | 7/2005 | Sugiyama et al. | |
| 2009/0214823 A1 | 8/2009 | Cheng et al. | |
| 2014/0346141 A1* | 11/2014 | Brizard | G03F 7/0002 216/49 |
| 2015/0034595 A1* | 2/2015 | Seshimo | G03F 7/20 216/49 |
| 2015/0118851 A1* | 4/2015 | Gao | H01L 21/31138 438/703 |
| 2016/0122859 A1* | 5/2016 | Cushen | G03F 7/0002 216/49 |
| 2016/0186002 A1 | 6/2016 | Hustad et al. | |
| 2016/0186003 A1 | 6/2016 | Hustad et al. | |
| 2016/0251539 A1* | 9/2016 | Hustad | C09D 153/00 427/385.5 |
| 2016/0357110 A1* | 12/2016 | Zhou | C09D 153/00 |
| 2016/0357111 A1* | 12/2016 | Jain | C08F 293/00 |
| 2016/0357112 A1* | 12/2016 | Jain | G03F 7/20 |
| 2017/0008992 A1* | 1/2017 | Lee | C07F 7/1804 |
| 2017/0170008 A1* | 6/2017 | Park | C09D 125/08 |

FOREIGN PATENT DOCUMENTS

| | | |
|---|---|---|
| JP | 2002-519728 A | 7/2002 |
| JP | 2003-218383 A | 7/2003 |
| JP | 2008-149447 A | 7/2008 |
| JP | 2010-58403 A | 3/2010 |

OTHER PUBLICATIONS

International Search Report and Written Opinion dated Sep. 19, 2017 in PCT/JP2017/023649 (with English Translation), 14 pages.
Office Action dated Jan. 26, 2021 in Japanese Patent Application No. 2018-526314, 5 pages (with English translation).
Office Action dated Nov. 22, 2021 in Korean Patent Application No. 10-2019-7000047 (with English translation), 12 pages.
Office Action dated Jul. 13, 2021 in Japanese Patent Application No. 2018-526314 (with English translation), 8 pages.

\* cited by examiner

*Primary Examiner* — John S Chu
(74) *Attorney, Agent, or Firm* — Element IP, PLC

(57) ABSTRACT

A composition for pattern formation includes a first polymer, a second polymer and a solvent. The first polymer includes: a first block including a first structural unit derived from a substituted or unsubstituted styrene; and a second block including a second structural unit other than the first structural unit. The second polymer includes: the first structural unit; and a group bonding to at least one end of a main chain thereof and including a polar group. The polar group is preferably a hydroxy group or a carboxyl group. A number average molecular weight of the second polymer is preferably no greater than 6,000. A mass ratio of the second polymer to the first polymer is preferably no less than 0.15 and no greater than 0.4. The solvent preferably comprises a compound comprising a hydroxyl group and an alkyl ester group.

19 Claims, 2 Drawing Sheets

COMPOSITION FOR PATTERN FORMATION, AND PATTERN-FORMING METHOD

CROSS-REFERENCE TO RELATED APPLICATIONS

The present application is a continuation application of International Application No. PCT/JP2017/023649, filed Jun. 27, 2017, which claims priority to Japanese Patent Application No. 2016-135509, filed Jul. 7, 2016. The contents of these applications are incorporated herein by reference in their entirety.

BACKGROUND OF THE INVENTION

Field of the Invention

The present invention relates to a composition for pattern formation, and a pattern-forming method.

Discussion of the Background

Microfabrication of various types of electronic device structures such as semiconductor devices and liquid crystal devices has been accompanied by demands for miniaturization of patterns in pattern formation processes. In these days, although fine patterns having a line width of about 50 nm can be formed using, for example, an ArF excimer laser, further finer pattern formation has been required.

To meet these demands, a forming method of a directed self-assembled pattern has been proposed that employs a phase separation (micro-domain) structure provided by so-called directed self-assembly in which a regular pattern is spontaneously formed. As such a forming method of a directed self-assembled pattern, a method of forming an ultrafine pattern by way of directed self-assembly using a block copolymer obtained through copolymerization of one monomer compound having a specific property with another monomer compound different in property from the one monomer compound (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to the aforementioned method, annealing of a film containing the block copolymer enables formation of a pattern in a self-aligned manner, through a feature that polymer structures of the same property tend to cluster. In addition, a method of forming a fine pattern through directed self-assembly of a composition containing a plurality of polymers each having a distinct property has also been known (see US Patent Application Publication No. 2009/0214823 and Japanese Unexamined Patent Application, Publication No. 2010-58403).

SUMMARY OF THE INVENTION

According to an aspect of the present invention, a composition for pattern formation includes a first polymer, a second polymer and a solvent. The first polymer includes: a first block including a first structural unit derived from a substituted or unsubstituted styrene; and a second block including a second structural unit other than the first structural unit. The second polymer includes: the first structural unit; and a group bonding to at least one end of a main chain thereof and including a polar group.

According to another aspect of the present invention, a pattern-forming method includes applying the composition on at least an upper face side of a substrate directly or via other layer to form a coating film. Phase separation of the coating film is carried out such that a plurality of phases of the coating film are formed. A part of the plurality of phases of the coating film is removed after the phase separation such that a resist pattern of the coating film is formed. The substrate is etched using directly or indirectly the resist pattern formed after the removing as a mask.

DESCRIPTION OF EMBODIMENTS

Figure 1:
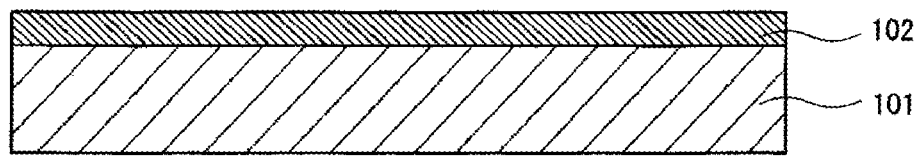
FIG. 1 is a schematic view showing an example of a state after forming an underlayer film on a substrate in the pattern-forming method of the embodiment of the present invention.

According to one embodiment of the invention made for solving the aforementioned problems, a composition for pattern formation contains a first polymer (hereinafter, may be also referred to as "(A) polymer" or "polymer (A)") having: a first block (hereinafter, may be also referred to as "block (I)") including a first structural unit (hereinafter, may be also referred to as "structural unit (I)") derived from a substituted or unsubstituted styrene; and a second block (hereinafter, may be also referred to as "block (II)") including a second structural unit (hereinafter, may be also referred to as "structural unit (II)") other than the structural unit (I), a second polymer (hereinafter, may be also referred to as "(B) polymer" or "polymer (B)") having: the structural unit (I); and a group bonding to at least one end of a main chain thereof and including a polar group, and a solvent (hereinafter, may be also referred to as "(C) solvent" or "solvent (C)").

According to another embodiment of the invention made for solving the aforementioned problems, a pattern-forming method includes: forming a coating film on at least an upper face side of a substrate directly or via other layer using the composition for pattern formation according to the one embodiment; carrying out phase separation of the coating film such that a plurality of phases of the coating film are formed; removing a part of the plurality of phases of the coating film after the phase separation such that a resist pattern of the coating film is formed; and etching the substrate using directly or indirectly the resist pattern formed after the removing.

According to the composition for pattern formation, and the pattern-forming method of the embodiments of the present invention, formation of a phase separation structure that is sufficiently fine and, even in a case with a pitch being great (for example, greater than 40 nm), superior in perpendicular orientation property, and in turn formation of a resist pattern that is fine and has a favorable shape, are enabled. Therefore, these can be suitably used in a pattern formation process in manufacture of various types of electronic devices such as a semiconductor device and a liquid crystal device, in which further progress of miniaturization is demanded. Hereinafter, embodiments of the present invention will be described in detail. It is to be noted that the present invention is not limited to the following embodiments.

Composition for Pattern Formation

The composition for pattern formation according to an embodiment of the present invention contains the polymer (A), the polymer (B), and the solvent (C). The composition for pattern formation may contain optional component(s) within a range not leading to impairment of the effects of the present invention. Formation of a resist pattern is enabled by: forming, from the composition for pattern formation of the present embodiment, a film (directed self-assembled film) having a phase separation structure provided through directed self-assembly on at least an upper face side of a substrate; and then removing a part of the plurality of phases of the directed self-assembled film. Hereinafter, each component is explained.

The term "directed self-assembly" as referred to herein means a phenomenon of spontaneously constructing a tissue or a structure without resulting from only the control from an external factor.

(A) Polymer

The polymer (A) has: the block (I) including the structural unit (I) derived from a substituted or unsubstituted styrene; and the block (II) including the structural unit (II) other than the structural unit (I). Each of these blocks preferably has a chain structure of structural units derived from one type of monomer. In other words, the block (I) has a chain structure of structural units (I) derived from the substituted or unsubstituted styrene, while the block (II) has a chain structure of structural units (IT) other than the structural units (I).

The polymer (A) is at least a diblock copolymer having two blocks, i.e., the block (I) and the block (II). The polymer (A) is not limited to the diblock copolymer and may also be, for example, a triblock copolymer having three blocks, a tetrablock copolymer having four blocks, and the like. Of these, from the perspective that the desired fine pattern can be more readily formed, the diblock copolymer and the triblock copolymer are preferred, and the diblock copolymer is more preferred. The polymer (A) may have a linking group between the blocks.

When the polymer (A) having a plurality of the blocks described above is dissolved in an appropriate solvent, the blocks of the same type aggregate, thereby forming phases each constituted of the same type of blocks. It is presumed that since phases constituted of different types of blocks do not blend with each other in the phase formation, formation of the phase separation structure is enabled having a regular pattern in which different types of phases are provided periodically and alternately.

Block (I)

The block (I) is not particularly limited as long as the structural unit (I) derived from the substituted or unsubstituted styrene is included, and is preferably a polystyrene block. The substituted or unsubstituted styrene that gives the structural unit (I) is exemplified by:

styrene;

substituted styrenes, e.g.,

α-methylstyrene; and substituted styrenes, for example, electron donating group-substituted styrene such as o-, m- or p-methylstyrene, p-t-butylstyrene, 2,4,6-trimethylstyrene, p-methylstyrene, p-t-butoxystyrene and o-, m- or p-vinylstyrene, as well as electron attractive group-substituted styrenes such as o-, m- or p-hydroxystyrene, m- or p-chloromethylstyrene, p-chlorostyrene, p-bromostyrene, p-iodostyrene, p-nitrostyrene and p-cyanostyrene. These styrenes may be used either alone of one type, or in combination of two or more types thereof.

Block (II)

The block (II) is not particularly limited as long as the structural unit (II) other than the structural unit (I) is included, and is exemplified by a poly(meth)acrylic acid ester block, a polyalkylene glycol block, a polyvinyl acetal block, a polyurethane block, a polyurea block, a polyimide block, a polyamide block, an epoxy block, a novolak phenol block, a polyester block, a polyalkylene carbonate block, a polydialkylsiloxane block, a polyalkylsilyl (meth)acrylate block, and the like. Of these, the poly(meth)acrylic acid ester block, the polyalkylene glycol block, the polyester block, the polyalkylene carbonate block, the polydialkylsiloxane block and the polyalkylsilyl (meth)acrylate block are preferred, and the poly(meth)acrylic acid ester block is more preferred, in light of ease of formation of the phase separation structure and ease of phase removal.

The poly(meth)acrylic acid ester block includes a structural unit derived from a (meth)acrylic acid ester as the structural unit (II). Examples of a monomer that gives the poly(meth)acrylic acid ester block include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid alicyclic hydrocarbon group esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid substituted alkyl esters such as 2-hydroxyethyl (meth)acrylate, 3-hydroxyadamantyl (meth)acrylate and 3-glycidylpropyl (meth)acrylate; and the like.

The polyalkylene glycol block includes as the structural unit (II), a structural unit derived from alkylene glycol. Examples of a monomer that gives the polyalkylene glycol block include ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and the like.

Block Configuration of (A) Polymer

The polymer (A) may be: a diblock copolymer including the polystyrene block and a polyalkyl (meth)acrylate block; a diblock copolymer including the polystyrene block and the polyalkylene glycol block; a triblock copolymer including the polystyrene block, the polyalkyl (meth)acrylate block and the polyalkylene glycol block; or any of the copolymers further including a block other than those mentioned above. From the perspective that a pattern having a finer microdomain structure can be formed, the diblock copolymer including the polystyrene block and the polyalkyl (meth) acrylate block is preferred.

The polymer (A) constituted only of the polystyrene block and the polyalkyl (meth)acrylate block is exemplified by a diblock copolymer, a triblock copolymer, a tetrablock copolymer, and the like. Of these, from the perspective that a pattern having the desired fine micro-domain structure can be readily formed, the diblock copolymer and the triblock copolymer are preferred, and the diblock copolymer is more preferred.

Examples of the diblock copolymer include: a copolymer having a structure of polystyrene block/polyalkyl (meth) acrylate block; and the like. Of these, a diblock copolymer having a structure in which, for example, a group including a polar group, etc. bonds to an end of a main chain of the alkyl poly(meth)acrylate block.

Examples of the triblock copolymer include: a copolymer having a structure of polystyrene block/polyalkyl (meth) acrylate block/polystyrene block; a copolymer having a structure of polyalkyl (meth)acrylate block/polystyrene block/polyalkyl (meth)acrylate block; and the like.

Examples of the tetrablock copolymer include: a copolymer having a structure of polystyrene block/polyalkyl (meth)acrylate block/polystyrene block/polyalkyl (meth) acrylate block; and the like.

Of these, from the perspective that a pattern having the desired fine micro-domain structure can be readily formed, the diblock copolymer and the triblock copolymer are preferred, the diblock copolymer is more preferred, and the diblock copolymer having the structure of polystyrene block/polyalkyl (meth)acrylate block is still more preferred.

In the case in which the polymer (A) is the diblock copolymer, a ratio of the proportion by mass of the structural unit (I) to that of the structural unit (II) contained in the polymer (A) may be appropriately selected in accordance with a line/space width ratio of the desired line-and-space pattern, the desired dimension of a contact hole pattern or a cylinder pattern, and the like. When a line-and-space pattern is to be formed, the lower limit of the mass ratio is preferably 20/80 and more preferably 35/65, from the perspective that a more favorable phase separation structure can be formed. The upper limit of the mass ratio is preferably 80/20, and more preferably 65/35. When a contact hole pattern or a cylinder pattern is to be formed, the lower limit of the mass ratio is preferably 10/90 and more preferably 20/80. The upper limit of the mass ratio is preferably 90/10, and more preferably 80/20.

Linking Group

The polymer (A) may have a linking group between adjacent blocks. When the polymer (A) has the linking group, defects of a regular array structure of the directed self-assembled film to be formed may be further inhibited. The linking group is exemplified by a divalent organic group having 1 to 5 carbon atoms, and the like.

A monomer that gives the linking group is exemplified by diphenylethylene, stilbene, and the like. Diphenylethylene and stilbene are capable of stabilizing an anion terminal generated during the synthesis of the polymer (A) through anionic polymerization. Thus, a dispersity index (Mw/Mn ratio) of the obtained polymer (A) is further reduced, resulting in further inhibition of variation in dimension of a pattern to be formed. The polymer (A) may include a single linking group, or a combination of two or more linking groups, depending on the number of blocks, the desired pattern configuration, and the like.

The lower limit of the weight average molecular weight (Mw) of the polymer (A) as determined by gel permeation chromatography (GPC) is preferably 1,000, more preferably 1,500, and still more preferably 2,000. Meanwhile, the upper limit of the Mw is preferably 150,000, more preferably 120,000, and still more preferably 100,000. When the Mw of the polymer (A) falls within the above range, the composition for pattern formation enables formation of a pattern having a finer and more favorable micro-domain structure.

The upper limit of the ratio (Mw/Mn, dispersity index) of the Mw to the number average molecular weight (Mn) of the polymer (A) is preferably 5, more preferably 3, still more preferably 2, particularly preferably 1.5, and more particularly preferably 1.2. The lower limit of the Mw/Mn ratio is typically 1, and preferably 1.01. When the Mw/Mn ratio falls within the above range, the composition for pattern formation enables formation of a pattern having a finer and more favorable micro-domain structure.

The weight average molecular weight (Mw) and the number average molecular weight (Mn) were determined by gel permeation chromatography (GPC) using GPC columns (G2000 HXL×2, G3000 HXL×1 and G4000 HXL×1 available from Tosoh Corporation), a differential refractometer as a detector, and mono-dispersed polystyrene as a standard, under analytical conditions involving a flow rate of 1.0 mL/min, an elution solvent of tetrahydrofuran, a sample concentration of 1.0% by mass, an amount of an injected sample of 100 μL, and a column temperature of 40° C.

The lower limit of the content of the polymer (A) with respect to the total solid content in the composition for pattern formation is preferably 80% by mass, more preferably 90% by mass, still more preferably 95% by mass, and particularly preferably 99% by mass. The "total solid content" of the composition for pattern formation as referred to means the sum of the components other than the solvent (C).

The lower limit of the concentration of the polymer (A) in the composition for pattern formation is preferably 0.3% by mass, more preferably 0.7% by mass, still more preferably 1.0% by mass, and particularly preferably 1.3% by mass. Meanwhile, the upper limit of the concentration of the polymer (A) in the composition for pattern formation is preferably 5% by mass, more preferably 3% by mass, still more preferably 2% by mass, and particularly preferably 1.7% by mass.

Synthesis Process of Polymer (A)

The polymer (A) may be synthesized through living anionic polymerization, living radical polymerization or the like. Of these, living anionic polymerization which enables the arbitrary end structure to be easily introduced is more preferred. For example, the block copolymer (A) may be synthesized by linking while polymerizing the polystyrene block, a polymethyl methacrylate block and the other block (s) in a desired order, and then subjecting polymer ends thereof to a treatment with an arbitrary chain-end treatment agent.

For example, in a case in which the polymer (A) that is a diblock copolymer constituted with the polystyrene block and the polymethyl methacrylate block is to be synthesized, styrene is polymerized first using an anion polymerization initiator in an appropriate solvent to synthesize the polystyrene block. Next, a polymethyl methacrylate block is similarly synthesized by polymerizing methyl methacrylate so as to link to the polystyrene block. Thereafter, a treatment with a chain-end treatment agent such as methanol is carried out to complete the synthesis of the polymer (A). It is to be noted that in regard to each of these blocks, for example, the synthesis can be executed by a process including e.g., adding a solution containing a monomer dropwise into a reaction solvent containing an initiator to permit a polymerization reaction.

Examples of the solvent for use in the polymerization include:

alkanes such as n-pentane, n-hexane, n-heptane, n-octane, n-nonane and n-decane;

alicyclic hydrocarbons such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents may be used either alone, or two or more types thereof may be used in combination.

The reaction temperature in the polymerization may be predetermined ad libitum depending on the type of the initiator, and the lower limit of the reaction temperature is typically −150° C., and more preferably −80° C. The upper limit of the reaction temperature is preferably 50° C., and more preferably 40° C. The lower limit of a reaction time period is preferably 5 min, and more preferably 20 min. The upper limit of the reaction time period is preferably 24 hrs, and more preferably 12 hrs.

Examples of the initiator for use in the polymerization include alkyllithiums, alkylmagnesium halides, naphthalene sodium, alkylated lanthanoid compounds, and the like. Of these, an alkyllithium compound is preferably used in a case where the polymerization is carried out using styrene, methyl methacrylate or the like as a monomer.

In regard to the method for the chain-end treatment, for example, terminal modification is carried out by adding the chain-end treatment agent such as methanol to a block copolymer obtained, followed by subjecting to a demetallation treatment with an acid, or the like, whereby the specific block copolymer is obtained.

(B) Polymer

The polymer (B) has: the structural unit (I) derived from a substituted or unsubstituted styrene; and a group (hereinafter, may be also referred to as "terminal group") bonding to at least one end of a main chain thereof and including a polar group. The polymer (B) may include a structural unit other than the structural unit (I). Such a structural unit is exemplified by the structural units exemplified as the structural unit (II) included in the polymer (A), and the like. It is to be noted that the polymer (B) may be either a homopolymer synthesized from one type of monomer compound, or a copolymer synthesized from multiple types of monomer compounds. Therefore, the polymer (B) may be synthesized by: providing a structure including the structural unit (I) and other structural unit as needed; and then subjecting the polymer ends to a treatment with an appropriate chain-end treatment agent to introduce the terminal group thereto. Due to the structure having the polar group at at least one end of the main chain thereof, the polymer (B) contributes to stabilization of an interface between two adjacent phases during the phase separation, thereby promoting the phase separation. Accordingly, it is presumed that the composition for pattern formation is thus capable of forming the phase separation structure that is finer and more superior in perpendicular orientation property, in comparison to conventional compositions.

The terminal group includes a polar group. The polar group is exemplified by a group including a hetero atom that is largely different in electronegativity from a carbon atom or a hydrogen atom, and the like. The hetero atom is not particularly limited, and is preferably an oxygen atom, a nitrogen atom, a sulfur atom, a phosphorus atom, a tin atom, a silicon atom, or a combination thereof; more preferably an oxygen atom, a nitrogen atom or a sulfur atom; still more preferably an oxygen atom or a sulfur atom; and particularly preferably an oxygen atom. Examples of the polar group include a hydroxy group, a carboxy group, an amino group, a sulfanyl group, and the like. Of these, a hydroxy group, a carboxy group and a sulfanyl group are preferred; a hydroxy group and a carboxy group are more preferred; and a hydroxy group is still more preferred.

As the terminal group, the group represented by the following formula (1) is preferred. This group includes a hydroxy group as the polar group.

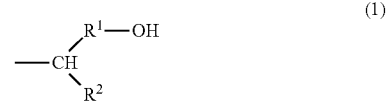

In the above formula (1), $R^1$ represents a single bond or a divalent organic group having 1 to 30 carbon atoms; and $R^2$ represents a hydrogen atom or a monovalent organic group having 1 to 30 carbon atoms.

The divalent organic group having 1 to 30 carbon atoms which may be represented by $R^1$ is exemplified by a divalent chain hydrocarbon group having 1 to 30 carbon atoms, a divalent alicyclic hydrocarbon group having 3 to 30 carbon atoms, a divalent aromatic hydrocarbon group having 6 to 30 carbon atoms, a group having between adjacent carbon atoms in any one of these hydrocarbon groups a group including a hetero atom such as an oxygen atom or a nitrogen atom, and the like.

Examples of the divalent chain hydrocarbon group having 1 to 30 carbon atoms include a methanediyl group, an ethanediyl group, a n-propanediyl group, an i-propanediyl group, a n-butanediyl group, an i-butanediyl group, a n-pentanediyl group, an i-pentanediyl group, a n-hexanediyl group, an i-hexanediyl group and the like. Of these, from the perspective that the composition for pattern formation is more likely to undergo the phase separation, a methanediyl group and an ethanediyl group are preferred, and a methanediyl group is more preferred.

Examples of the divalent alicyclic hydrocarbon group having 3 to 30 carbon atoms include a cyclopropanediyl group, a cyclobutanediyl group, a cyclopentanediyl group, a cyclohexanediyl group, a cyclooctanediyl group, a norbornanediyl group, an adamantanediyl group, and the like.

Examples of the divalent aromatic hydrocarbon group having 6 to 30 carbon atoms include a benzenediyl group, a naphthalenediyl group, an anthracenediyl group, and the like.

Examples of the group including a hetero atom included between adjacent carbon atoms in the hydrocarbon group include —O—, —CO—, —COO—, —OCO—, —NO—, —NH$_2$—, and the like.

$R^1$ represents preferably a single bond or the divalent chain hydrocarbon group having 1 to 30 carbon atoms; more preferably a methanediyl group or an ethanediyl group; and still more preferably a methanediyl group.

The monovalent organic group having 1 to 30 carbon atoms which may be represented by $R^2$ is exemplified by a monovalent chain hydrocarbon group having 1 to 30 carbon atoms, a monovalent alicyclic hydrocarbon group having 3 to 30 carbon atoms, a monovalent aromatic hydrocarbon group having 6 to 30 carbon atoms, a group having between adjacent carbon atoms in any one of these hydrocarbon groups a group including a hetero atom such as an oxygen atom or a nitrogen atom, and the like.

Examples of the monovalent chain hydrocarbon group having 1 to 30 carbon atoms include a methyl group, an ethyl group, a n-propyl group, an i-propyl group, a n-butyl group, an i-butyl group, a n-pentyl group, an i-pentyl group, a n-hexyl group, an i-hexyl group and the like.

Examples of the monovalent alicyclic hydrocarbon group having 3 to 30 carbon atoms include a cyclopropyl group, a cyclobutyl group, a cyclopentyl group, a cyclohexyl group, a cyclooctyl group, a norbornyl group, an adamantyl group, and the like.

Examples of the monovalent aromatic hydrocarbon group having 6 to 30 carbon atoms include a phenyl group, a naphthalenyl group, an anthracenyl group, and the like.

Examples of the group including a hetero atom included between adjacent carbon atoms in the hydrocarbon group include —O—, —CO—, —COO—, —OCO—, —NO—, —NH$_2$—, and the like.

$R^2$ represents preferably a hydrogen atom, the chain hydrocarbon group having 1 to 30 carbon atoms, or a group having —O— between adjacent carbon atoms in the chain hydrocarbon group having 1 to 30 carbon atoms; and more preferably a hydrogen atom, a chain hydrocarbon group having 1 to 3 carbon atoms, or a group having —O— between adjacent carbon atoms in a chain hydrocarbon group having 1 to 10 carbon atoms.

The terminal group is exemplified by: groups represented by the following formulae (1-1) to (1-58) (hereinafter, may be also referred to as "groups (1-1) to (1-58)"); a 2-hydroxy-1-phenylethyl group; a 2-hydroxy-2-phenylethyl group; a sulfanylethyl group; and the like.

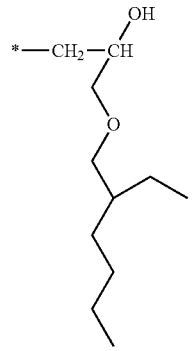

(1-1)

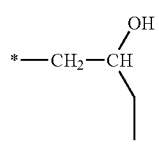

(1-2)

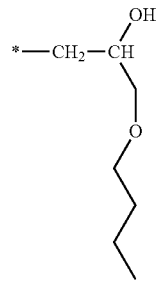

(1-3)

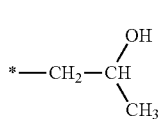

(1-4)

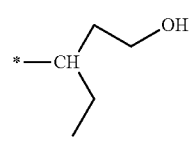

(1-5)

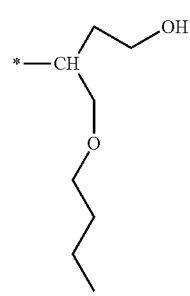

(1-6)

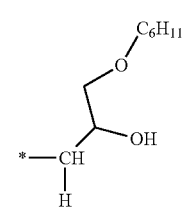

(1-7)

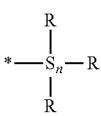

(1-8)

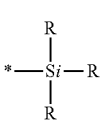

(1-9)

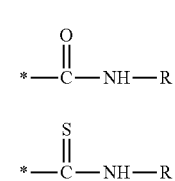

(1-10)

(1-11)

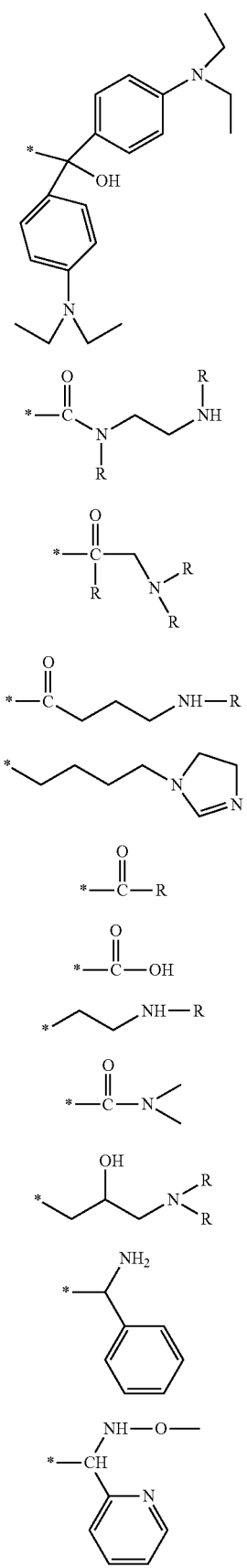
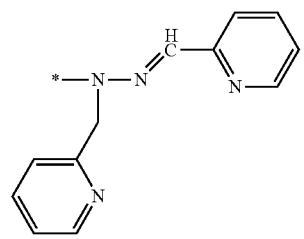
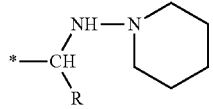
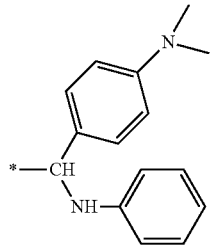
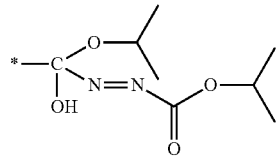
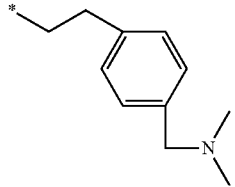
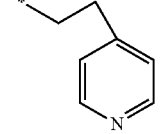
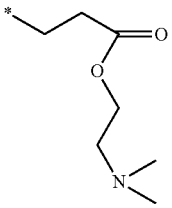
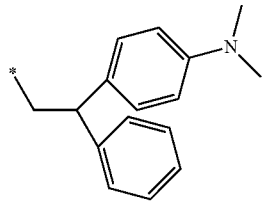

(1-32) 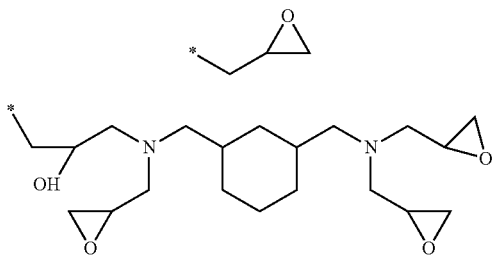
(1-33) 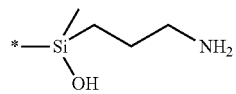
(1-34) 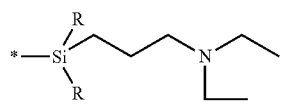
(1-35) 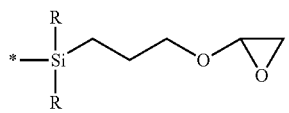
(1-36) 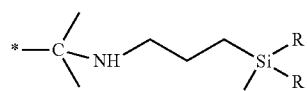
(1-37) 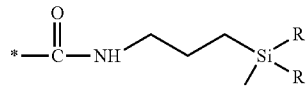
(1-38) 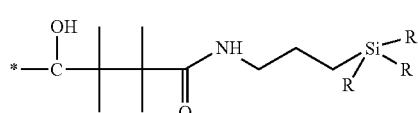
(1-39) 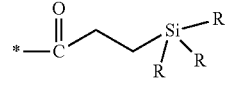
(1-40) 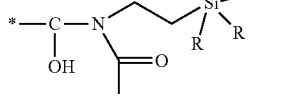
(1-41) 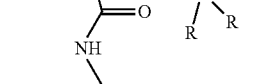
(1-42) 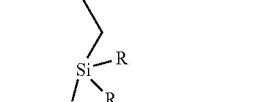
(1-43) 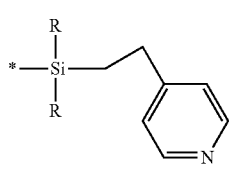
(1-44) 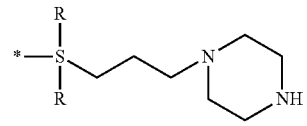
(1-45) 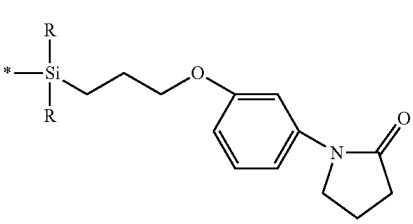
(1-46) 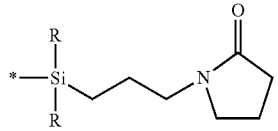
(1-47) 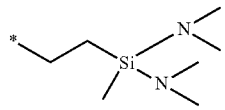
(1-48) 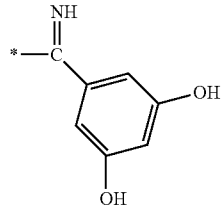
(1-49) 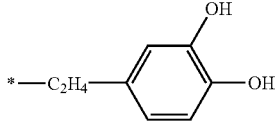
(1-50) 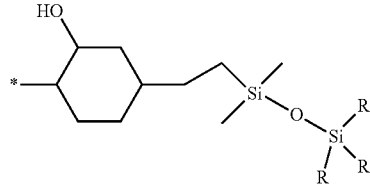
(1-51) 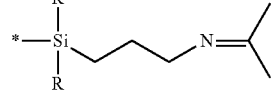
(1-52) 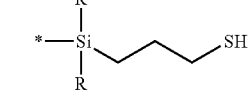

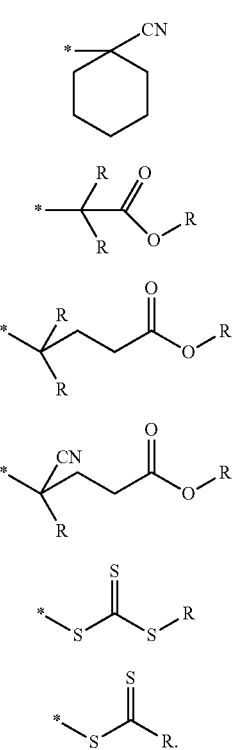

(1-53)

(1-54)

(1-55)

(1-56)

(1-57)

(1-58)

In the above formulae, R represents a hydrogen atom or a monovalent organic group, and * denotes a binding site to a carbon atom at an end of a polymer main chain in the polymer (B).

Of these, the group in which the polar group is a hydroxy group or a carboxyl group is preferred; the groups (1-1) to (1-7) and (1-18), as well as a 2-hydroxy-1-phenylethyl group, a 2-hydroxy-2-phenylethyl group and the sulfanylethyl group are more preferred; the group (1-1), the group (1-18), a 2-hydroxy-1-phenylethyl group, a 2-hydroxy-2-phenylethyl group and a sulfanylethyl group are still more preferred.

The structural unit to which the terminal group bonds in the polymer (B) may be either the structural unit (I) or a structural unit other than the structural unit (I), and is preferably the structural unit (I). In the case in which the terminal group bonds to the structural unit (I), the composition for pattern formation enables formation of a pattern having a finer and more favorable micro-domain structure.

The lower limit of the mass ratio of the polymer (B) to the polymer (A) is preferably 0.05, more preferably 0.15, still more preferably 0.2, and particularly preferably 0.25. The upper limit of the mass ratio is preferably 0.5, more preferably 0.4, still more preferably 0.35, and particularly preferably 0.3. When the mass ratio of the polymer (B) to the polymer (A) falls within the above range, the composition for pattern formation enables formation of a pattern having a finer and more favorable micro-domain structure.

Synthesis Process of Polymer (B)

The polymer (B) may be synthesized through anionic polymerization, radical polymerization or the like, and living anionic polymerization which enables the arbitrary end structure to be easily introduced is preferred. For example, the block copolymer (B) may be synthesized by linking while polymerizing the polystyrene block and the other block(s) in a desired order, and then subjecting polymer ends thereof to a treatment with an arbitrary chain-end treatment agent to introduce the terminal group thereto.

For example, in a case in which the polymer (B), i.e., the second polymer, that is constituted with the polystyrene block is to be synthesized, styrene is polymerized first using an anion polymerization initiator in an appropriate solvent to synthesize the polystyrene block. Thereafter, carrying out a treatment with a chain-end treatment agent such as 1,2-butyleneoxide enables the terminal group to be introduced to an end of a main chain of the polystyrene block. It is to be noted that for synthesis of each of the blocks, the process described in relation to the synthesis of the polymer (A), i.e., the first polymer, may be suitably adopted.

The process for the chain-end treatment is exemplified by a process shown in the following scheme, and the like. Specifically, terminal modification is carried out by adding the chain-end treatment agent such as 1,2-butylene oxide to a polymer obtained, followed by subjecting to a demetallation treatment with an acid, or the like, whereby the polymer that includes the terminal group represented by the above formula (1) at the end, for example, is obtained.

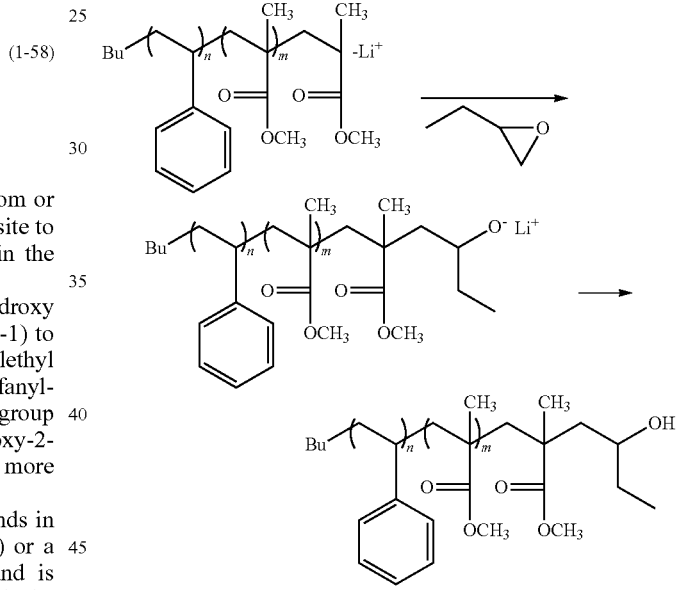

In the above scheme, n and m are each independently an integer of 10 to 5,000.

Examples of the chain-end treatment agent include:

epoxy compounds such as 1,2-butylene oxide, butyl glycidyl ether, 2-ethylhexyl glycidyl ether, propylene oxide, ethylene oxide and epoxy amine;

nitrogen-containing compounds such as an isocyanate compound, a thioisocyanate compound, imidazolidinone, imidazole, amino ketone, pyrrolidone, diethyl amino benzophenone, a nitrile compound, aziridine, formamide, epoxy amine, benzyl amine, an oxime compound, azine, hydrazone, imine, azocarboxylic acid ester, amino styrene, vinyl pyridine, amino acrylate, amino diphenyl ethylene and an imide compound;

silane compounds such as alkoxy silane, amino silane, ketoimino silane, isocyanate silane, siloxane, glycidyl silane, mercapto silane, vinyl silane, epoxy silane, pyridyl silane, piperazyl silane, pyrrolidone silane, cyano silane and silane isocyanate;

tin halides; silicon halides; carbon dioxide; and the like. Of these, the epoxy compounds are preferred; and 1,2-butylene oxide, butyl glycidyl ether, 2-ethylhexyl glycidyl ether and propylene oxide are more preferred.

The polymer (B) having been subjected to the chain-end treatment is preferably collected by a reprecipitation technique. Specifically, after completion of the chain-end treatment reaction, the reaction liquid is charged into a reprecipitation solvent to collect the desired copolymer in a powder form. As the reprecipitation solvent, an alcohol, an alkane and the like may be used either alone, or as a mixture of two or more types thereof. Alternatively to the reprecipitation technique, the polymer may be collected by removing low-molecular weight components such as monomers and oligomers by a liquid separation technique, a column technique, an ultrafiltration technique and the like.

The upper limit of the Mn of the polymer (B) is preferably 6,000, more preferably 5,000, and still more preferably 4,000. The lower limit of the Mn is preferably 1,000, more preferably 1,500, and still more preferably 2,000. When the Mn of the polymer (B) falls within the above range, the composition for pattern formation enables formation of a pattern having a finer and more favorable micro-domain structure.

The upper limit of the Mw of the polymer (B) is preferably 10,000, more preferably 8,000, and still more preferably 6,000. The lower limit of the Mw is preferably 1,000, more preferably 2,000, and still more preferably 3,000. When the Mw of the polymer (B) falls within the above range, the composition for pattern formation enables formation of a pattern having a finer and more favorable micro-domain structure.

The upper limit of the Mw/Mn ratio of the polymer (B) is preferably 5, more preferably 3, still more preferably 2, and particularly preferably 1.8. The lower limit of the Mw/Mn ratio is typically 1, more preferably 1.1, and still more preferably 1.3. When the Mw/Mn ratio falls within the above range, the composition for pattern formation enables formation of a pattern having a finer and more favorable micro-domain structure.

(C) Solvent

The solvent (C) is not particularly limited as long as it is a solvent capable of dissolving or dispersing at least the polymer (A), the polymer (B) and other optional component(s) contained as needed.

The solvent (C) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherated solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

lactic acid ester solvents such as methyl lactate, ethyl lactate, n-butyl lactate, and n-amyl lactate;

polyhydric alcohol partially etherated acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, diethyl malonate, dimethyl phthalate, and diethyl phthalate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

The solvent (C) preferably contains a compound (hereinafter, may be also referred to as "compound (C)") having a hydroxyl group and an alkyl ester group, in light of more improvement in perpendicular orientation property of the phase separation structure formed from the composition for pattern formation. The hydroxyl group is preferably a secondary hydroxyl group. The term "secondary hydroxyl group" as referred to means a hydroxyl group that bonds to a carbon atom to which one hydrogen atom bonds. The term "alkyl ester group" as referred to means a group represented by —COOR' (R' being an alkyl group). The alkyl ester group is exemplified by a methoxy carbonyl group, an ethoxy carbonyl group, a propoxy carbonyl group, a butoxy carbonyl group, and the like.

Examples of the compound (C) preferred include:

compounds having a primary hydroxyl group and the alkyl ester group, e.g., glycolic acid alkyl esters such as methyl glycolate and ethyl glycolate, and 3-hydroxypropionic acid alkyl esters such as methyl 3-hydroxypropionate and ethyl 3-hydroxypropionate;

compounds having the secondary hydroxyl group and the alkyl ester group, e.g., lactic acid alkyl esters such as methyl lactate, ethyl lactate, propyl lactate and butyl lactate, 2-hydoxy butanoic acid alkyl esters such as methyl 2-hydroxybutanoate and ethyl 2-hydroxybutanoate, 2-hydroxy pentanoic acid alkyl esters such as methyl 2-hydroxypentanoate and ethyl 2-hydroxypentanoate, 2-hydroxy malonic acid alkyl esters such as dimethyl 2-hydroxymalonate and monomethyl 2-hydroxymalonate, 2-hydroxy succinic acid alkyl esters such as dimethyl 2-hydroxysuccinate and monomethyl 2-hydroxysuccinate, and 2,3-dihydroxy butanoic acid alkyl esters such as dimethyl 2,3-dihydroxybutanoate and monomethyl 2,3-dihydroxybutanoate; and compounds having a tertiary hydroxyl group and the alkyl ester group, such as methyl 2-hydroxy-2-methylpropanoate and methyl 2-hydroxy-2-methylbutanoate.

Of these, the compounds having the secondary hydroxyl group and the alkyl ester group are preferred, the lactic acid alkyl esters are more preferred, and ethyl lactate and butyl lactate are particularly preferred.

The lower limit of the content of the compound (C) in the composition for pattern formation is preferably 20% by mass, and more preferably 25% by mass. The upper limit of the content of the compound (C) is preferably 50% by mass, and more preferably 40% by mass. When the content of the compound (C) is less than the lower limit, the effect produced by the compound (C) being contained may be insufficient. To the contrary, when the content of the compound (C) is greater than the upper limit, solubility of the polymer (A) and the polymer (B) therein may be inferior.

The solvent (C) is preferably the ester solvent, more preferably the polyhydric alcohol partially etherated acetate solvent or the compound having the secondary hydroxyl group and the alkyl ester group, still more preferably the polyhydric alcohol partially etherated acetate solvent or the lactic acid ester solvent, and particularly preferably propylene glycol monomethyl ether acetate, butyl lactate or butyl lactate. The composition for pattern formation may contain either one, or two or more types of the solvent (C).

Optional Component

An optional component that may be contained in the composition for pattern formation is exemplified by a surfactant and the like. When the surfactant is contained, the application property of the composition for pattern formation to the substrate is enabled to be more improved.

Pattern-Forming Method

The pattern-forming method according to another embodiment of the present invention includes: forming a coating film on at least an upper face side of the substrate directly or via other layer using the composition for pattern formation (hereinafter, may be also referred to as "coating film-forming step"); carrying out phase separation of the coating film such that a plurality of phases of the coating film are formed (hereinafter, may be also referred to as "phase separation step"); removing a part of the plurality of phases of the coating film after the phase separation such that a resist pattern of the coating film is formed (hereinafter, may be also referred to as "removing step"); and etching the substrate using directly or indirectly the resist pattern formed after the removing (hereinafter, may be also referred to as "etching step"). Hereinafter, each step is explained.

Coating Film-Forming Step

In this step, a coating film is formed on at least an upper face side of the substrate directly or via other layer using the composition for pattern formation.

The composition for pattern formation may be applied either directly on a substrate 101 or via other layer on an upper face side of the substrate 101. The other layer is exemplified by an underlayer film 102 illustrated in FIG. 1, and the like. In addition, a prepattern 103 illustrated in FIG. 2 may also be formed on the substrate 101. When the underlayer film 102 is provided as the other layer, the phase separation structure (micro-domain structure) of the directed self-assembled film can be more easily controlled since the structure is changed also by an interaction with the underlayer film 102, in addition to the interaction between the adjacent blocks in the polymer (A) contained in the composition for pattern formation, thereby enabling the desired pattern to be obtained. Furthermore, in the case of the directed self-assembled film being a thin film, providing the underlayer film 102 enables a transfer process to be improved. Moreover, by providing the prepattern 103, the pattern configuration obtained through the phase separation of the composition for pattern formation is controlled, thereby enabling the desired fine pattern to be formed.

As the substrate 101, a conventionally well-known substrate such as, for example, a silicon wafer, a wafer coated with aluminum, or the like may be used.

The underlayer film 102 may be formed from, for example, a conventionally well-known organic underlayer film-forming material. The procedure for forming the underlayer film 102 is not particularly limited. The underlayer film 102 may be formed by, for example, providing a film on the substrate 101 through coating by a well-known procedure such as a spin coating method, and then hardening the film through exposure and/or heating. The radioactive ray for use in the exposure is exemplified by a visible light ray, an ultraviolet ray, a far ultraviolet ray, an X-ray, an electron beam, a γ-ray, a molecular beam, an ion beam, and the like. The temperature in the heating of the film is not particularly limited. The lower limit of the temperature is preferably 90° C., while the upper limit of the temperature is preferably 550° C., more preferably 450° C., and still more preferably 300° C. The thickness of the underlayer film 102 is not particularly limited, and the lower limit of the average thickness is preferably 50 nm and more preferably 70 nm. The upper limit of the average thickness is preferably 20,000 nm, and more preferably 1,000 nm. The underlayer film 102 preferably includes an SOC (Spin on Carbon) film.

Figure 2:
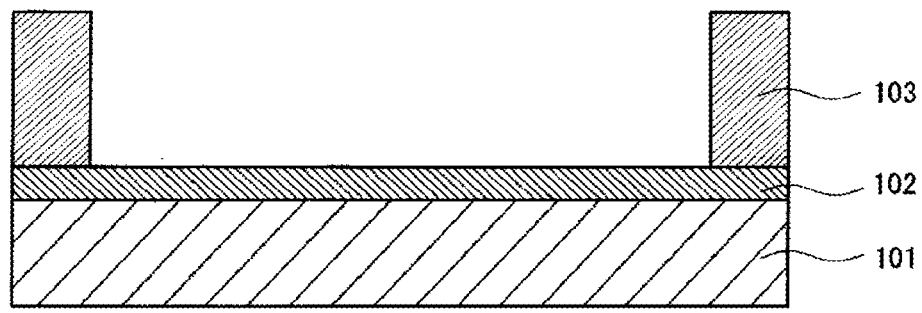
FIG. 2 is a schematic view showing an example of a state after forming a prepattern on the underlayer film in the pattern-forming method of the embodiment of the present invention.

The prepattern 103 may be formed on the underlayer film 102 as illustrated in FIG. 2, for example using a prepattern forming-material. As the procedure for forming the prepattern 103, those similar to well-known resist pattern-forming methods, and the like may be employed. In addition, a conventional composition for resist film formation may be used as the material for prepattern formation. In a specific method for formation of the prepattern 103, for example, a commercially available chemical amplification-type resist composition is applied on the underlayer film 102 to provide a resist film. Next, an exposure is carried out by irradiating a desired region of the resist film with a radioactive ray through a mask having a specific pattern. Examples of the radioactive ray include ultraviolet rays, far ultraviolet rays, X-rays, charged particle rays, and the like. Of these, far ultraviolet rays such as ArF excimer laser beams and KrF excimer laser beams are preferred, and ArF excimer laser beams are more preferred. For the exposure, liquid immersion lithography may be employed. Subsequently, post exposure baking (PEB) is carried out, followed by development using a developer solution such as an alkaline developer solution or an organic solvent, whereby a desired prepattern 103 can be formed. It is to be noted that the surface of the prepattern 103 may be subjected to a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the aforementioned directed self-assembly to be accelerated.

Figure 3:
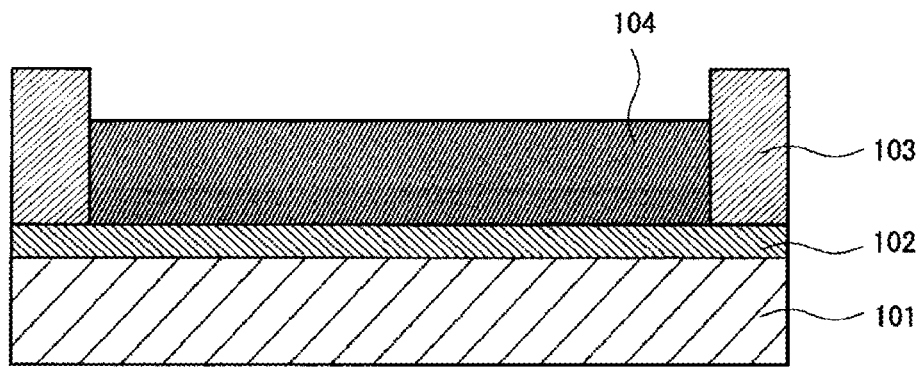
FIG. 3 is a schematic view showing an example of a state after applying a composition for pattern formation to a region surrounded by the prepattern on the underlayer film in the pattern-forming method of the embodiment of the present invention.
Figure 4:
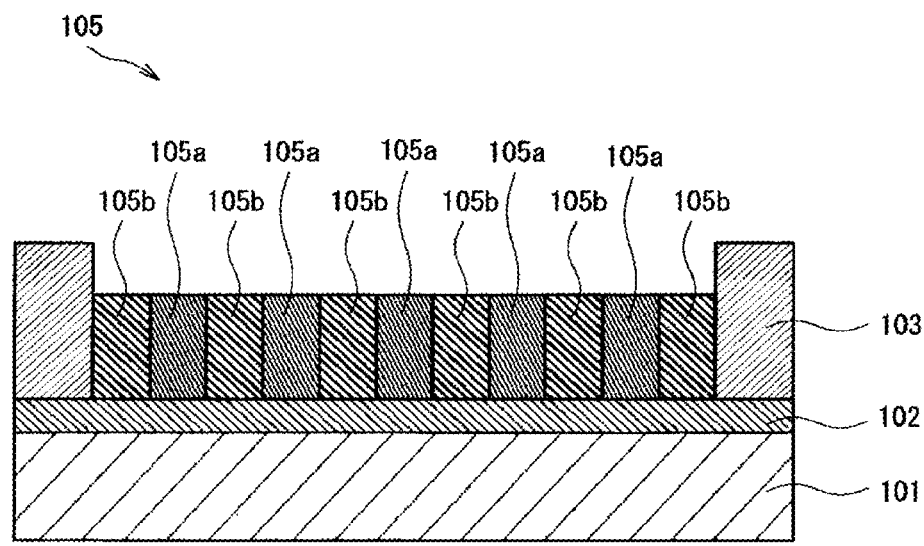
FIG. 4 is a schematic view showing an example of a state after forming a directed self-assembled film in the region surrounded by the prepattern on the underlayer film in the pattern-forming method of the embodiment of the present invention.

In the case in which the underlayer film 102 has been provided, the composition for pattern formation is applied on the underlayer film 102. In the case in which the underlayer film 102 and the prepattern 103 have been provided, the composition for pattern formation is applied in a region surrounded by the prepattern 103 on the underlayer film 102 to obtain a coating film 104 as illustrated in FIGS. 3 and 4.

The applying procedure of the composition for pattern formation is not particularly limited, and examples thereof include a spin-coating method, and the like.

Phase Separation Step

In this step, the coating film 104 is subjected to phase separation. The phase separation procedure is exemplified by an annealing procedure and the like.

The annealing procedure may be, for example, heating with an oven, a hot plate or the like at a temperature of no less than 80° C. and no greater than 400° C. The annealing time period is typically no less than 1 min and no greater than 120 min, and preferably no less than 5 min and no greater than 90 min. The average thickness of a directed self-assembled film 105 thus obtained is preferably no less than 0.1 nm and no greater than 500 nm, and more preferably no less than 0.5 nm and no greater than 100 nm.

In the case in which the underlayer film 102 is provided, formation of the directed self-assembled film 105 is enabled that has a phase separation structure having interfaces substantially perpendicular to the substrate 101. Specifically, applying on the substrate the composition for pattern formation containing the polymer (A) having at least two types of blocks that are not miscible with each other and then carrying out the annealing and the like enable promotion of the so-called directed self-assembly, in which blocks of the same property cluster to form a regular pattern spontaneously. Thus, formation of the directed self-assembled film having the phase separation structure such as a sea-island structure, a cylinder structure, a co-continuous structure, a lamellar structure or the like is enabled; and the phase separation structure preferably has interfaces substantially perpendicular to the substrate 101. In this step, due to using the composition for pattern formation, the phase separation is more likely to occur, thereby enabling the finer phase separation structure (micro-domain structure) to be formed.

In the case of using the prepattern 103, among the blocks included in the polymer (A) contained in the composition for pattern formation, blocks having higher affinity to a lateral face of the prepattern form a phase along the prepattern, while blocks having lower affinity to the lateral face form a phase at a position spaced apart from the prepattern. The desired pattern is thus enabled to be formed. Furthermore, through the choice of material, size, shape and the like of the prepattern, a meticulous control is enabled of a structure of the pattern to be obtained by the phase separation of the composition for pattern formation. The prepattern may be appropriately selected in accordance with the desired pattern to be ultimately formed and, for example, a line-and-space pattern, a hole pattern, and the like may be employed.

It is preferred that the phase separation structure is formed along the prepattern, and it is more preferred that interfaces provided through the phase separation are substantially horizontal to the lateral face of the prepattern. For example in the case in which the prepattern 103 and the styrene block in the polymer (A) have a high affinity to each other, a lamellar phase separation structure including: a styrene block phase (105*b*) formed linearly along the prepattern 103; and a polymethyl methacrylate phase (105*a*) and the styrene block phase (105*b*) being alternately provided in this order, or the like is formed. It is to be noted that, although the phase separation structure formed in this step includes a plurality of phases, and interfaces provided by these phases are typically substantially perpendicular, the interfaces may not necessarily be definite. A meticulous control of the phase separation structure to be obtained through the choice of: a ratio of lengths of block chains (styrene block chain, polymethyl methacrylate block chain, etc.) in the polymer (A); a molecular length of the polymer (A); the prepattern; and the like, enables the desired fine pattern to be formed.

Removing Step

Figure 5:
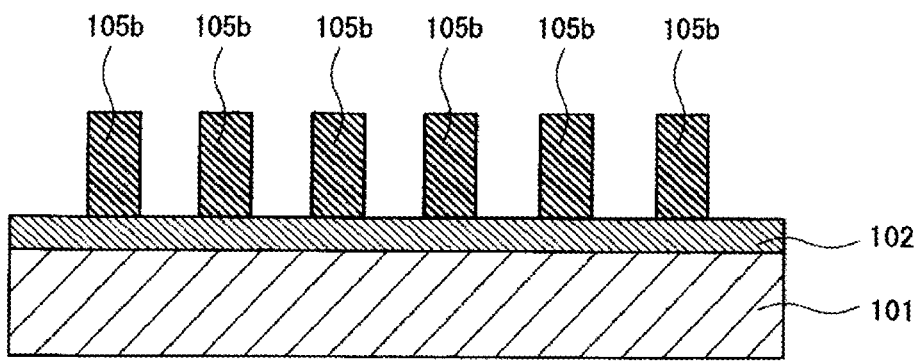
FIG. 5 is a schematic view showing an example of a state after removing a part of the plurality of phases of the directed self-assembled film and the prepattern.

In this step, a part of the plurality of phases of the coating film after the phase separation is removed. For example, as shown in FIGS. 4 and 5, a part of the block phases (block phase 105*a*) in the phase separation structure included in the directed self-assembled film 105 is removed. Using the difference in the etching rate of each phase generated by phase separation through the directed self-assembly, the polymethyl methacrylate block phase 105*a* can be removed by an etching treatment. A state attained after removing the polymethyl methacrylate block phase 105*a* in the phase separation structure and the prepattern 103 as described later is shown in FIG. 5. It is to be noted that before the etching treatment, an irradiate with a radioactive ray may be carried out as needed. As the radioactive ray, in a case where the phase to be removed by the etching is a polymethyl methacrylate block phase, a radioactive ray of 254 nm may be used. Since the irradiation with the radioactive ray leads to decomposition of the polymethyl methacrylate block phase, the etching may be more facilitated.

As the removing procedure of the polymethyl methacrylate block phase 105a in the phase separation structure included in the directed self-assembled film 105, well-known procedures e.g., reactive ion etching (RIE) such as chemical dry etching and chemical wet etching; physical etching such as sputter etching and ion beam etching; and the like may be exemplified. Among these, reactive ion etching (RIE) is preferred, and chemical dry etching carried out by using a $CF_4$ gas, an $O_2$ gas or the like, and chemical wet etching (wet development) carried out by using an etching solution such as an organic solvent or hydrofluoric acid are more preferred. Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, 2-butanone, 4-methyl-2-pentanone and 2-heptanone; alcohols such as methanol, ethanol, 1-propanol, 2-propanol and 4-methyl-2-pentanol; and the like. These solvents may be used either alone, or two or more types thereof may be used in combination.

Prepattern-Removing Step

In this step, the prepattern 103 is removed as shown in FIGS. 4 and 5. By removing the prepattern 103, formation of a finer and more complicated pattern is enabled. It is to be noted that with respect to the removing procedure of the prepattern 103, description regarding the removing procedure of the part of block phases (block phase 105a) in the phase separation structure is applicable. Furthermore, this step may be carried out simultaneously with the removing step described above, or may be carried put before or after the removing step.

Etching Step

In this step, the substrate is etched by directly or indirectly using the resist pattern formed through the removing step.

According to this step, for example, after the removing step, the substrate or the substrate with the underlayer film is etched by using as a mask a resist pattern consisting of the polystyrene block phase 105b that is a block phase of a part of the phase separation film remaining. After completion of the patterning onto the substrate, the phases used as the mask are removed from the substrate by a dissolving treatment or the like, whereby a patterned substrate (pattern) can be finally obtained. As the etching procedure, a procedure similar to that exemplified in connection with the above removing step may be employed, and the etching gas and the etching solution may be appropriately selected in accordance with the materials of the underlayer film and the substrate. For example, in a case where the substrate is a silicon material, a gas mixture of chlorofluorocarbon-containing gas and $SF_4$, or the like may be used. In a case in which the substrate is a metallic film, a gas mixture of $BCl_3$ and $Cl_2$ or the like may be used. The pattern obtained by the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not limited to these Examples. Measuring methods for various types of physical properties are shown below.

Weight Average Molecular Weight (Mw) and Number Average Molecular Weight (Mn)

The Mw and the Mn of the polymer were determined by gel permeation chromatography (GPC) using GPC columns ("G2000 HXL"×2, "G3000 HXL"×1 and "G4000 HXL"×1, available from Tosoh Corporation) under the following condition:
eluent: tetrahydrofuran (Wako Pure Chemical Industries, Ltd.);
flow rate: 1.0 mL/min;
sample concentration: 1.0% by mass;
amount of sample injected: 100 μL;
column temperature: 40° C.;
detector: differential refractometer; and
standard substance: mono-dispersed polystyrene.

$^1$H-NMR Analysis $^1$H-NMR analysis was carried out using a nuclear magnetic resonance apparatus ("JNM-ECX400", available from JEOL, Ltd.). The proportion of each structural unit contained in each polymer was calculated from the area ratio of the peak corresponding to each structural unit in the spectrum obtained by the $^1$H-NMR.

Synthesis of Polymer (A)

Synthesis Example 1

After a 500-mL flask as a reaction vessel was dried under reduced pressure, 200 g of tetrahydrofuran (THF) which had been subjected to a distillation dehydrating treatment in a nitrogen atmosphere was charged, and cooled to −78° C. Thereafter, 0.29 mL (0.256 mmol) of a 1 N cyclohexane solution of sec-butyllithium (sec-BuLi) was charged into this THF, and then 22.7 mL (0.197 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Thereafter, 0.11 mL (0.00077 mol) of 1,1-diphenylethylene, and 1.02 mL (0.0005 mol) of a 0.5 N THF solution of lithium chloride were added thereto, and the polymerization system color was ascertained to be dark red. Furthermore, 10.6 mL (0.100 mol) of methyl methacrylate which had been subjected to: adsorptive filtration by means of silica gel for removing the polymerization inhibitor; and a dehydration treatment by distillation was added dropwise to the reaction mixture over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the reaction mixture was elevated to the room temperature, and the mixture was concentrated. Substitution with methyl isobutyl ketone (MIBK) was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and then the resulting solution was concentrated. Subsequently, the concentrate thus obtained was added dropwise into 500 g of methanol to allow the polymer to be precipitated. The solid was collected on a Buechner funnel. Next, in order to remove the polystyrene homopolymer, 500 g of cyclohexane was poured such that the polystyrene homopolymer was dissolved in cyclohexane, thereby washing the polymer. This operation was repeated four times, and again the solid was collected on a Buechner funnel. Thus obtained polymer was dried under reduced pressure at 60° C. to give 24.1 g of a white polymer (A-1).

This polymer (A-1) had the Mw of 79,000, the Mn of 77,000, and the Mw/Mn of 1.03. In addition, as a result of the $^1$H-NMR analysis, the proportions of the structural unit derived from styrene, and the structural unit derived from methyl methacrylate were 65.0% by mass (65.0 mol %) and 35.0% by mass (35.0 mol %), respectively. The polymer (A-1) was a diblock copolymer.

Synthesis Example 2

After a 500-mL flask as a reaction vessel was dried under reduced pressure, 200 g of THF which had been subjected to a distillation dehydrating treatment in a nitrogen atmosphere was charged, and cooled to −78° C. Thereafter, 0.29 mL (0.256 mmol) of a 1 N cyclohexane solution of sec-butyllithium (sec-BuLi) was charged into this THF, and then 22.7 mL (0.197 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Thereafter, 0.11 mL (0.00077 mol) of 1,1-diphenylethylene, and 1.02 mL (0.0005 mol) of a 0.5 N THF solution of lithium chloride were added thereto, and the polymerization system color was ascertained to be dark red. Furthermore, 10.6 mL (0.100 mol) of methyl methacrylate which had been subjected to: adsorptive filtration by means of silica gel for removing the polymerization inhibitor; and a dehydration treatment by distillation was added dropwise to the reaction mixture over 30 min. The polymerization system color was ascertained to be light yellow, and thereafter the reaction was allowed to proceed for 120 min. Subsequently, 0.053 mL (0.256 mmol) of 2-ethylhexyl glycidyl ether as a chain-end terminator, and then 1 mL of methanol were charged to conduct a terminating reaction of the polymerization end. The temperature of the reaction mixture was elevated to the room temperature, and the mixture was concentrated. Substitution with methyl isobutyl ketone (MIBK) was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Next, in order to remove the polystyrene homopolymer, 500 g of cyclohexane was poured such that the polystyrene homopolymer was dissolved in cyclohexane, thereby washing the polymer. This operation was repeated four times, and again the solid was collected on a Buechner funnel. Thus obtained polymer was dried under reduced pressure at 60° C. to give 24.1 g of a white polymer (A-2).

This polymer (A-2) had the Mw of 78,000, the Mn of 76,000, and the Mw/Mn of 1.03. In addition, as a result of the $^1$H-NMR analysis, in the polymer (A-2), the proportions of the structural unit derived from styrene, and the structural unit derived from methyl methacrylate were 65.0% by mass (65.0 mol %) and 35.0% by mass (35.0 mol %), respectively. The block polymer (A-2) was a diblock copolymer.

Synthesis Example 3

After a 500-mL flask as a reaction vessel was dried under reduced pressure, 200 g of THF which had been subjected to a distillation dehydrating treatment in a nitrogen atmosphere was charged, and cooled to −78° C. Thereafter, 0.28 mL (0.256 mmol) of a 1 N cyclohexane solution of sec-butyllithium (sec-BuLi) was charged into this THF, and then 26.0 mL (0.226 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Thereafter, 0.11 mL (0.00077 mol) of 1,1-diphenylethylene, and 1.02 mL (0.0005 mol) of a 0.5 N THF solution of lithium chloride were added thereto, and the polymerization system color was ascertained to be dark red. Furthermore, 9.5 mL (0.899 mol) of methyl methacrylate which had been subjected to: adsorptive filtration by means of silica gel for removing the polymerization inhibitor; and a dehydration treatment by distillation was added dropwise to the reaction mixture over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Next, in order to remove the polystyrene homopolymer, 500 g of cyclohexane was poured such that the polystyrene homopolymer was dissolved in cyclohexane, thereby washing the polymer. This operation was repeated four times, and again the solid was collected on a Buechner funnel. Thus obtained polymer was dried under reduced pressure at 60° C. to give 23.8 g of a white polymer (A-3).

This polymer (A-3) had the Mw of 77,000, the Mn of 75,000, and the Mw/Mn of 1.03. In addition, as a result of the $^1$H-NMR analysis, the proportions of the structural unit derived from styrene, and the structural unit derived from methyl methacrylate were 70.0% by mass (70.0 mol %) and 30.0% by mass (30.0 mol %), respectively. The polymer (A-3) was a diblock copolymer.

Synthesis of Polymer (B)

Synthesis Example 4

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.31 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.7 g of a white polymer (B-1).

This polymer (B-1) had the Mw of 5,600, the Mn of 5,300, and the Mw/Mn of 1.06.

Synthesis Example 5

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, a mixture of 0.18 mL (2.38 mmol) of propylene sulfide and 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at normal temperature while shielding light to give 11.3 g of a white polymer (B-2).

This polymer (B-2) had the Mw of 5,200, the Mn of 5,000, and the Mw/Mn of 1.04.

Synthesis Example 6

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.31 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, a mixture of 0.14 mL (2.31 mmol) of ethylene sulfide and 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at normal temperature while shielding light to give 11.1 g of a white polymer (B-3).

This polymer (B-3) had the Mw of 5,300, the Mn of 5,100, and the Mw/Mn of 1.04.

Synthesis Example 7

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, a mixture of 0.27 mL (2.30 mmol) of styrene oxide and 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.7 g of a white polymer (B-4).

This polymer (B-4) had the Mw of 5,500, the Mn of 5,100, and the Mw/Mn of 1.08.

Synthesis Example 8

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyl-lithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, 0.32 mL (2.30 mmol) of 4-chloromethyl-2,2-dimethyl-1,3-dioxolane as a chain-end terminator was charged to conduct a terminating reaction of the polymerization end. Next, 10 g of a 1 N aqueous hydrochloric acid solution was charged thereinto, and the mixture was stirred under heating at 60° C. for 2 hrs to permit a hydrolysis reaction. A polymer having a diol structure as the terminal group was thus obtained. The reaction mixture was cooled to the room temperature and concentrated, and then substitution with MIBK was carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.1 g of a white block copolymer (B-5).

This polymer (B-5) had the Mw of 5,300, the Mn of 4,900, and the Mw/Mn of 1.08.

Synthesis Example 9

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyl-lithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, a mixture of 0.48 mL (2.30 mmol) of 2-ethylhexyl glycidyl ether and 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.2 g of a white polymer (B-6).

This polymer (B-6) had the Mw of 5,100, the Mn of 4,700, and the Mw/Mn of 1.09.

Synthesis Example 10

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyl-lithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, bubbling with carbon dioxide as a chain-end terminator was carried out, and 1 mL of methanol was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel.

Thus obtained polymer was dried under reduced pressure at 60° C. to give 11.3 g of a white polymer (B-7).

This polymer (B-7) had the Mw of 5,200, the Mn of 5,000, and the Mw/Mn of 1.04.

Synthesis Example 11

After a 500-mL flask as a reaction vessel was dried under reduced pressure, 120 g of THF which had been subjected to a distillation dehydrating treatment in a nitrogen atmosphere was charged, and cooled to −78° C. Thereafter, 3.95 mL (3.84 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.7 g of a white polymer (B-8).

This block copolymer (B-8) had the Mw of 3,200, the Mn of 3,000, and the Mw/Mn of 1.06.

Synthesis Example 12

After a 500-mL flask as a reaction vessel was dried under reduced pressure, 120 g of THF which had been subjected to a distillation dehydrating treatment in a nitrogen atmosphere was charged, and cooled to −78° C. Thereafter, 3.96 mL (3.84 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, a mixture of 0.44 mL (3.84 mmol) of styrene oxide and 1 mL of methanol as a chain-end terminator was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.7 g of a white polymer (B-9).

This polymer (B-9) had the Mw of 3,200, the Mn of 3,000, and the Mw/Mn of 1.07.

Synthesis Example 13

After a 500-mL flask as a reaction vessel was dried under reduced pressure, 120 g of THF which had been subjected to a distillation dehydrating treatment in a nitrogen atmosphere was charged, and cooled to −78° C. Thereafter, 3.96 mL (3.84 mmol) of a 1 N cyclohexane solution of sec-butyllithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, bubbling with carbon dioxide as a chain-end terminator was carried out, and 1 mL of methanol was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.5 g of a white polymer (B-10).

This polymer (B-10) had the Mw of 3,500, the Mn of 3,100, and the Mw/Mn of 1.13.

Synthesis Example 14

After a 500-mL flask as a reaction vessel was dried under reduced pressure, 120 g of THF which had been subjected to a distillation dehydrating treatment in a nitrogen atmosphere was charged, and cooled to −78° C. Thereafter, 1.70 mL (0.0120 mmol) of 1,1-diphenylethylene, 16.0 mL (0.008 mol) of a 1 M tetrahydrofuran solution of lithium chloride, 4.12 mL (4.00 mmol) of a 1 N cyclohexane solution of sec-butyllithium (sec-BuLi) was charged into this THF, and then 12.7 mL (0.120 mol) of methyl methacrylate which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 120 min. Subsequently, 1 mL of methanol was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.0 g of a white polymer (B-11).

This polymer (B-11) had the Mw of 3,200, the Mn of 3,000, and the Mw/Mn of 1.07.

Synthesis Example 15

After a 500-mL flask as a reaction vessel was dried under reduced pressure, 120 g of THF which had been subjected to a distillation dehydrating treatment in a nitrogen atmosphere was charged, and cooled to −78° C. Thereafter, 2.38 mL (2.30 mmol) of a 1 N cyclohexane solution of sec-butyl-lithium (sec-BuLi) was charged into this THF, and then 13.3 mL (0.115 mol) of styrene which had been subjected to: adsorptive filtration by means of silica gel for removing the polymerization inhibitor; and a dehydration treatment by distillation was added dropwise over 30 min. The polymerization system color was ascertained to be orange. During the dropwise addition, the internal temperature of the reaction mixture was carefully controlled so as not to be −60° C. or higher. After completion of the dropwise addition, aging was permitted for 30 min. Subsequently, 0.20 mL (2.30 mmol) of allyl bromide was charged to conduct a terminating reaction of the polymerization end. The temperature of the reaction mixture was elevated to the room temperature, and the mixture was concentrated. Substitution with MIBK was then carried out. Thereafter, 1,000 g of a 2% by mass aqueous oxalic acid solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated. The solid was collected on a Buechner funnel. Thus obtained polymer was dried under reduced pressure at 60° C. to give 11.1 g of a white polymer (B-12).

This polymer (B-12) had the Mw of 5,700, the Mn of 5,200, and the Mw/Mn of 1.10.

Synthesis of Polymer for Underlayer Film Formation

Synthesis Example 16

Into a 200-mL three-neck flask equipped with a condenser, a dropping funnel and a thermometer were charged 40 g of anisole, 16.7 g of styrene (0.160 mol), 3.00 g of methyl methacrylate (0.030 mol), 1.30 g of 2-hydroxyethylmethacrylate (0.01 mol), 0.29 g of copper (II) bromide (2.00 mmol) and 0.46 g of tris[(2-dimethylamino)ethyl]amine (2 mmol). After the mixture was heated to 100° C., 0.53 mL of 2-bromoisoethyl butyrate (3.6 mmol) was added thereto, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of tetrahydrofuran was added to a resin solution thus concentrated. The mixture was added to 1,000 g of a mix liquid of methanol/ultra pure water (5/5), whereby the polymer was precipitated. Thus resulting solid was collected with a Buechner funnel, and rinsed with 50 g of methanol. The solid thus obtained was dried under reduced pressure to give 11.2 g of a white polymer (d-1).

This polymer (d-1) had the Mw of 5,600, the Mn of 4,600, and the Mw/Mn of 1.22. In addition, as a result of the $^1$H-NMR analysis, the proportions of the structural unit derived from styrene, the structural unit derived from methyl methacrylate, and the structural unit derived from 2-hydroxyethyl methacrylate were 80 mol %, 15 mol %, and 5 mol %, respectively.

Synthesis Example 17

Into a 200-mL three-neck flask equipped with a condenser, a dropping funnel and a thermometer were charged 40 g of anisole, 14.6 g of styrene (0.140 mol), 6.00 g of methyl methacrylate (0.060 mol), 0.29 g of copper (II) bromide (2.00 mmol) and 0.46 g of tris[(2-dimethylamino)ethyl]amine (2.0 mmol). After the mixture was heated to 100° C., 0.58 mL of 2-hydroxyethyl 2-bromoisobutyrate (3.6 mmol) was added thereto using a syringe, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of tetrahydrofuran was added to a resin solution thus concentrated. The mixture was added to 1,000 g of a mix liquid of methanol/ultra pure water (5/5), whereby the polymer was precipitated. Thus resulting solid was collected with a Buechner funnel, and rinsed with 50 g of methanol. The solid thus obtained was dried under reduced pressure to give 11.5 g of a white polymer (d-2).

This polymer (d-2) had the Mw of 6,400, the Mn of 5,600, and the Mw/Mn of 1.14. In addition, as a result of the $^1$H-NMR analysis, the proportions of the structural unit derived from styrene and the structural unit derived from methyl methacrylate were 70 mol % and 30 mol %, respectively.

Synthesis Example 18

Into a 200-mL three-neck flask equipped with a condenser, a dropping funnel and a thermometer were charged 40 g of anisole, 16.7 g of styrene (0.160 mol), 4.00 g of methyl methacrylate (0.040 mol), 0.29 g of copper (II) bromide (2.00 mmol) and 0.46 g of tris[(2-dimethylamino)ethyl]amine (2 mmol). After the mixture was heated to 100° C., 0.58 mL of 2-hydroxyethyl 2-bromoisobutyrate (3.6 mmol) was added thereto using a syringe, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of tetrahydrofuran was added to a resin solution thus concentrated. The mixture was added to 1,000 g of a mix liquid of methanol/ultra pure water (5/5), whereby the polymer was precipitated. Thus resulting solid was collected with a Buechner funnel, and rinsed with 50 g of methanol. The solid thus obtained was dried under reduced pressure to give 11.4 g of a white polymer (d-3).

This polymer (d-3) had the Mw of 5,800, the Mn of 5,000, and the Mw/Mn of 1.16. In addition, as a result of the $^1$H-NMR analysis, the proportions of the structural unit derived from styrene and the structural unit derived from methyl methacrylate were 80 mol % and 20 mol %, respectively.

Preparation of Composition for Pattern Formation

Comparative Example 1

A composition for pattern formation (S-1) was prepared by adding 68.9 g of propylene glycol monomethyl ether acetate (PGMEA) as the solvent (C) and 29.6 g of ethyl lactate to 1.5 g of the polymer (A-1) as the polymer (A), stirring the mixture, and then filtering the solution through a high-density polyethylene filter having a pore size of 0.45 μm.

Examples 1 to 16 and Comparative Examples 2 to 7

Compositions for pattern formation (S-5) to (S-10) and (S-12) to (S-21) of Examples 1 to 16, and compositions for pattern formation (S-2) to (S-4), (S-11), (S-22) and (S-23) of Comparative Examples 2 to 7 were prepared in a similar manner to Comparative Example 1 except that the components shown in Tables 1 and 2 below were used.

In Table 1, "Comp." means "Comparative", and "Ex." means "Example". Table 1

TABLE 1

| (mass (g)) | | Composition for pattern formation | Comp. Ex. 1 | Comp. Ex. 2 | Comp. Ex. 3 | Comp. Ex. 4 | Ex. 1 | Ex. 2 | Ex. 3 | Ex. 4 | Ex. 5 | Ex. 6 | Comp. Ex. 5 | Ex. 7 |
|---|---|---|---|---|---|---|---|---|---|---|---|---|---|---|
| | | | S-1 | S-2 | S-3 | S-4 | S-5 | S-6 | S-7 | S-8 | S-9 | S-10 | S-11 | S-12 |
| (A) Polymer | A-1 | PSTMMA = 65/35, 77 K | 1.5 | | | 1.2 | 1.2 | 1.2 | 1.2 | 1.2 | 1.2 | 1.2 | 1.2 | 1.2 |
| | A-2 | PSTMMA-EHOH = 65/35, 76 K | | 1.5 | | | | | | | | | | |
| | A-3 | PSTMMA = 70/30, 76 K | | | 1.5 | | | | | | | | | |
| (B) Polymer | B-1 | PS-ω-H, 5 K | | | | 0.3 | | | | | | | | |
| | B-2 | PS-ω-PPS, 5 K | | | | | 0.3 | | | | | | | |
| | B-3 | PS-ω-SHp, 5 K | | | | | | 0.3 | | | | | | |
| | B-4 | PS-ω-SOX, 5 K | | | | | | | 0.3 | | | | | |
| | B-5 | PS-ω-DOH, 5 K | | | | | | | | 0.3 | | | | |
| | B-6 | PS-ω-EHGE, 5 K | | | | | | | | | 0.3 | | | |
| | B-7 | PS-ω-COOH, 5 K | | | | | | | | | | 0.3 | | |
| | B-8 | PS-ω-H, 3 K | | | | | | | | | | | 0.3 | |
| | B-9 | PS-ω-SOX, 3 K | | | | | | | | | | | | 0.3 |
| | B-10 | PS-ω-COOH, 3 K | | | | | | | | | | | | |
| | B-11 | PMMA, 3 K | | | | | | | | | | | | |
| | B-12 | PS-ω-Allyl, 5 K | | | | | | | | | | | | |
| (C) Solvent | C-1 | PGMEA | 68.9 | 68.9 | 68.9 | 68.9 | 68.9 | 68.9 | 68.9 | 68.9 | 68.9 | 68.9 | 68.9 | 68.9 |
| | C-2 | Ethyl lactate | 29.6 | 29.6 | 29.6 | 29.6 | 29.6 | 29.6 | 29.6 | 29.6 | 29.6 | 29.6 | 29.6 | 29.6 |
| | C-3 | Butyl lactate | | | | | | | | | | | | |

In Table 2, "Comp." means "Comparative", and "Ex." means "Example".

TABLE 2

| (mass (g)) | | Composition for pattern formation | Ex. 8 | Ex. 9 | Ex. 10 | Ex. 11 | Ex. 12 | Ex. 13 | Ex. 14 | Ex. 15 | Ex. 16 | Comp. Ex. 6 | Comp. Ex. 7 |
|---|---|---|---|---|---|---|---|---|---|---|---|---|---|
| | | | S-13 | S-14 | S-15 | S-16 | S-17 | S-18 | S-19 | S-20 | S-21 | S-22 | S-23 |
| (A) Polymer | A-1 | PSTMMA = 65/35, 77 K | 1.2 | 1.05 | 1.38 | 1.05 | 1.38 | 1.2 | 1.2 | 1.2 | 1.2 | 1.2 | 1.2 |
| | A-2 | PSTMMA-EHOH = 65/35, 76 K | | | | | | | | | | | |
| | A-3 | PSTMMA = 70/30, 76 K | | | | | | | | | | | |
| (B) Polymer | B-1 | PS-ω-H, 5 K | | | | | | | | | | | |
| | B-2 | PS-ω-PPS, 5 K | | | | | | | | | | | |
| | B-3 | PS-ω-SHp, 5 K | | | | | | | | | | | |
| | B-4 | PS-ω-SOX, 5 K | | 0.45 | 0.12 | | | 0.3 | 0.3 | 0.3 | | | |
| | B-5 | PS-ω-DOH, 5 K | | | | | | | | | | | |
| | B-6 | PS-ω-EHGE, 5 K | | | | | | | | | | | |
| | B-7 | PS-ω-COOH, 5 K | | | | | | | | | | | |
| | B-8 | PS-ω-H, 3 K | | | | | | | | | | | |
| | B-9 | PS-ω-SOX, 3 K | | | | 0.45 | 0.12 | | | | 0.3 | | |

TABLE 2-continued

|  |  |  | Ex. 8 | Ex. 9 | Ex. 10 | Ex. 11 | Ex. 12 | Ex. 13 | Ex. 14 | Ex. 15 | Ex. 16 | Comp. Ex. 6 | Comp. Ex. 7 |
|---|---|---|---|---|---|---|---|---|---|---|---|---|---|
|  | B-10 | PS-ω-COOH, 3 K | 0.3 |  |  |  |  |  |  |  |  |  |  |
|  | B-11 | PMMA, 3 K |  |  |  |  |  |  |  |  |  | 0.3 |  |
|  | B-12 | PS-ω-Allyl 5 K |  |  |  |  |  |  |  |  |  |  | 0.3 |
| (C) Solvent | C-1 | PGMEA | 68.9 | 68.9 | 68.9 | 68.9 | 68.9 | 98.5 | 88.7 | 78.8 | 68.9 | 68.9 | 68.9 |
|  | C-2 | Ethyl lactate | 29.6 | 29.6 | 29.6 | 29.6 | 29.6 |  | 9.8 | 19.7 |  | 29.6 | 29.6 |
|  | C-3 | Butyl lactate |  |  |  |  |  |  |  |  | 29.6 |  |  |

Preparation of Composition for Underlayer Film Formation

Preparation Example 1

A composition for underlayer film formation (D-1) was prepared by adding 98.8 g of propylene glycol monomethyl ether acetate (PGMEA) (solvent (C-1)) to 1.2 g of the polymer (d-1) to permit dissolution, and then filtering the solution through a high-density polyethylene filter having a pore size of 0.4 μm.

Preparation Examples 2 and 3

Compositions for underlayer film formation (D-2) and (D-3) were prepared in a similar manner to Preparation Example 1 except that the components shown in Table 3 below were used.

TABLE 3

| (mass (g)) | Composition for underlayer film formation |  | D-1 | D-2 | D-3 |
|---|---|---|---|---|---|
| Polymer | d-1 | PS-r-PMMA-r-HEMA | 1.2 |  |  |
|  | d-2 | α-OH-PS70-r-PMMA30 |  | 1.2 |  |
|  | d-3 | α-OH-PS80-r-PMMA20 |  |  | 1.2 |
| Solvent | C-1 | PGMEA | 98.8 | 98.8 | 98.8 |

Phase Separation of Directed Self-Assembled Film

Examples 17 to 42 and Comparative Examples 8 to 20

The composition for underlayer film formation (D-1) was spin-coated on a silicon substrate at 1,500 rpm by using a track ("TEL DSAACT12" available from Tokyo Electron Limited), and baked at 250° C. for 180 sec. The substrate was washed with PGMEA to remove the composition for underlayer film formation having been unreacted. The thickness of the underlayer film formed on the silicon substrate was about 3 nm as a result of the measurement of the film thickness with an ellipsometer. Next, the composition for pattern formation (S-1) was spin-coated at 1,500 rpm on the substrate. After the coating film (directed self-assembled film) was formed, phase separation was allowed by annealing under nitrogen at 220° C. for 60 sec to obtain a phase-separated directed self-assembled film (R-1). Phase-separated directed self-assembled films (R-2) to (R-40) were obtained using the aforementioned compositions for pattern formation with different underlayer films as shown in Tables 4 to 7 and allowing phase separation.

TABLE 4

|  |  |  | Phase-separated coating film (directed self-assembled film) |  |  |  |  |  |  |  |  |  |
|---|---|---|---|---|---|---|---|---|---|---|---|---|
|  |  |  | R-1 | R-2 | R-3 | R-4 | R-5 | R-6 | R-7 | R-8 | R-9 | R-10 |
| Composition for underlayer film formation | D-1 | PS-r-PMMA-r-HEMA | S-1 | S-2 | S-3 | S-4 | S-5 | S-6 | S-7 | S-8 | S-9 | S-10 |
|  | D-2 | α-OH-PS70-r-PMMA30 |  |  |  |  |  |  |  |  |  |  |
|  | D-3 | α-OH-PS80-r-PMMA20 |  |  |  |  |  |  |  |  |  |  |

TABLE 5

|  |  |  | Phase-separated coating film (directed self-assembled film) |  |  |  |  |  |  |  |  |  |
|---|---|---|---|---|---|---|---|---|---|---|---|---|
|  |  |  | R-11 | R-12 | R-13 | R-14 | R-15 | R-16 | R-17 | R-18 | R-19 | R-20 |
| Composition for underlayer film formation | D-1 | PS-r-PMMA-r-HEMA | S-11 | S-12 | S-13 | S-14 | S-15 | S-16 | S-17 | S-18 | S-19 | S-20 |
|  | D-2 | α-OH-PS70-r-PMMA30 |  |  |  |  |  |  |  |  |  |  |
|  | D-3 | α-OH-PS80-r-PMMA20 |  |  |  |  |  |  |  |  |  |  |

TABLE 6

| | | | Phase-separated coating film (directed self-assembled film) | | | | | | | | | |
|---|---|---|---|---|---|---|---|---|---|---|---|---|
| | | | R-21 | R-22 | R-23 | R-24 | R-25 | R-26 | R-27 | R-28 | R-29 | R-30 |
| Composition for underlayer film formation | D-1 D-2 D-3 | PS-r-PMMA-r-HEMA α-OH-PS70-r-PMMA30 α-OH-PS80-r-PMMA20 | S-21 | S-22 | S-1 | S-4 | S-7 | S-8 | S-10 | S-12 | S-13 | S-22 |

TABLE 7

| | | | Phase-separated coating film (directed self-assembled film) | | | | | | | | | |
|---|---|---|---|---|---|---|---|---|---|---|---|---|
| | | | R-31 | R-32 | R-33 | R-34 | R-35 | R-36 | R-37 | R-38 | R-39 | |
| Composition for underlayer film formation | D-1 D-2 D-3 | PS-r-PMMA-r-HEMA α-OH-PS70-r-PMMA30 α-OH-PS80-r-PMMA20 | S-23 | S-1 | S-4 | S-7 | S-8 | S-10 | S-12 | S-13 | S-22 | |

Resist Pattern Formation

After the substrates each having the directed self-assembled film subjected to phase separation thereon in Examples 17 to 42 and Comparative Examples 8 to 20 were irradiated with a radioactive ray of 172 nm at an intensity of 300 mJ/cm$^2$, the substrates were immersed in a solution of 2-propanol (IPA) to remove the phase consisting of poly (methyl methacrylate) blocks by dissolving. Accordingly, a hole pattern was formed.

Evaluations

In regard to each of the substrates having the resist pattern formed thereon, the pattern dimension (average diameter (nm) and average pitch (nm)) of the hole pattern over the substrate was measured by using "CG5000" available from Hitachi High-Technologies Corporation at a magnification of 100,000. Next, a SEM image was loaded into and analyzed by FCR (fingerprint contact hole roughness) function of "Terminal PC Software" available from Hitachi High-Technologies Corporation, and perpendicularity with respect to the substrate and circularity of the resist pattern were evaluated. Favorable holes were evaluated as "Normal hole", and unfavorable holes having a crescent shape or irregularity were evaluated as "Defect hole". When a ratio of the defect holes to the total holes (defect ratio) was less than 3%, the pattern was evaluated to be favorable; and when the ratio was 3% or greater, the pattern was evaluated to be unfavorable. The results of the evaluations are shown in Tables 8 to 10.

TABLE 8

| | | FCR analysis | | | | |
|---|---|---|---|---|---|---|
| | | Normal hole | Defect hole | Defect ratio | Average Diameter | Average Pitch |
| Example 17 | R-7 | 784 | 24 | 1.9% | 18.1 | 46.8 |
| Example 18 | R-8 | 882 | 13 | 1.5% | 18.2 | 47.1 |
| Example 19 | R-9 | 918 | 25 | 2.7% | 17.9 | 46.7 |
| Example 20 | R-10 | 916 | 16 | 1.7% | 17.5 | 46.2 |
| Example 21 | R-5 | 822 | 25 | 3.0% | 18.5 | 48.5 |
| Example 22 | R-6 | 709 | 44 | 6.2% | 18.4 | 49.8 |

TABLE 8-continued

| | | FCR analysis | | | | |
|---|---|---|---|---|---|---|
| | | Normal hole | Defect hole | Defect ratio | Average Diameter | Average Pitch |
| Example 23 | R-12 | 893 | 17 | 1.9% | 18.1 | 46.8 |
| Example 24 | R-13 | 901 | 14 | 1.6% | 18.2 | 46.7 |
| Example 25 | R-14 | 823 | 65 | 7.9% | 18.5 | 48.9 |
| Example 26 | R-15 | 824 | 37 | 4.5% | 18.6 | 48.5 |
| Example 27 | R-16 | 854 | 36 | 4.2% | 18.4 | 48.7 |
| Example 28 | R-17 | 821 | 30 | 3.7% | 18.3 | 48.6 |
| Example 29 | R-18 | 883 | 51 | 5.8% | 18.4 | 48.2 |
| Example 30 | R-19 | 865 | 32 | 3.7% | 18.6 | 47.9 |
| Example 31 | R-20 | 765 | 25 | 3.3% | 18.5 | 48.1 |
| Example 32 | R-21 | 903 | 16 | 1.8% | 18.1 | 46.9 |
| Comparative Example 8 | R-1 | 687 | 109 | 13.7% | 20.6 | 48.5 |
| Comparative Example 9 | R-2 | 710 | 121 | 17.0% | 20.5 | 48.3 |
| Comparative Example 10 | R-3 | 693 | 115 | 16.6% | 19.6 | 47.8 |
| Comparative Example 11 | R-4 | 815 | 36 | 4.4% | 18.7 | 48.6 |
| Comparative Example 12 | R-11 | 699 | 41 | 5.9% | 18.1 | 49.7 |
| Comparative Example 13 | R-22 | Failure in phase separation | | | | |

TABLE 9

| | | FCR analysis | | | | |
|---|---|---|---|---|---|---|
| | | Normal hole | Defect hole | Defect ratio | Average Diameter | Average Pitch |
| Example 33 | R-25 | 893 | 17 | 1.9% | 18.1 | 46.8 |
| Example 34 | R-26 | 882 | 13 | 1.4% | 18.2 | 47.1 |
| Example 35 | R-27 | 916 | 16 | 1.7% | 17.5 | 46.3 |
| Example 36 | R-28 | 893 | 17 | 1.9% | 18.1 | 46.8 |
| Example 37 | R-29 | 912 | 10 | 1.1% | 17.3 | 46.1 |
| Comparative Example 14 | R-23 | 687 | 109 | 13.7% | 20.6 | 48.5 |
| Comparative Example 15 | R-24 | 816 | 35 | 4.3% | 18.5 | 48.5 |

TABLE 9-continued

| | | FCR analysis | | | | |
|---|---|---|---|---|---|---|
| | | Normal hole | Defect hole | Defect ratio | Average Diameter | Average Pitch |
| Comparative Example 16 | R-30 | Failure in phase separation | | | | |
| Comparative Example 17 | R-31 | 756 | 35 | 4.6% | 18.0 | 49.0 |

TABLE 10

| | | FCR analysis | | | | |
|---|---|---|---|---|---|---|
| | | Normal hole | Defect hole | Defect ratio | Average Diameter | Average Pitch |
| Example 38 | R-34 | 895 | 20 | 2.2% | 18.1 | 46.8 |
| Example 39 | R-35 | 880 | 15 | 1.7% | 18.2 | 47.1 |
| Example 40 | R-36 | 921 | 20 | 2.2% | 17.5 | 46.3 |
| Example 41 | R-37 | 894 | 23 | 2.6% | 18.1 | 46.8 |
| Example 42 | R-38 | 910 | 21 | 2.3% | 17.3 | 46.1 |
| Comparative Example 18 | R-32 | 694 | 121 | 17.4% | 20.6 | 48.5 |
| Comparative Example 19 | R-33 | 814 | 40 | 4.9% | 18.5 | 48.5 |
| Comparative Example 20 | R-39 | Failure in phase separation | | | | |

As is clear from Tables 8 to 10, when the composition for pattern formation of any of Examples was used, a phase separation structure that was sufficiently fine and had a favorable perpendicular orientation property was formed, and in turn a resist pattern that was fine and had a favorable shape was obtained. On the other hand, when the composition for pattern formation of any of Comparative Examples was used, the phase separation was less likely to occur during the pattern formation, and in some cases the microdomain structure was not formed.

According to the composition for pattern formation, and the pattern-forming method of the embodiments of the present invention, formation of a phase separation structure that is sufficiently fine and superior in perpendicular orientation property, in turn formation of a resist pattern that is fine and has a favorable shape, are enabled. Therefore, these can be suitably used in a pattern formation process in manufacture of various types of electronic devices such as a semiconductor device and a liquid crystal device, in which further progress of miniaturization is demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A composition for pattern formation, consisting of:
a first polymer comprising: a first block comprising a first structural unit derived from a substituted or unsubstituted styrene; and a second block comprising a second structural unit derived from a (meth)acrylic acid ester;
a second polymer consisting of:
a main chain which is a homopolymer of a third structural unit derived from a substituted or unsubstituted styrene; and
a terminal group which bonds to at least one end of the main chain and which comprises a polar group;
a solvent comprising a compound which comprises: a secondary hydroxy group; and an alkyl ester group; and optionally, a surfactant.

2. The composition according to claim 1, wherein the polar group is a hydroxy group or a carboxyl group.

3. The composition according to claim 1, wherein a number average molecular weight of the second polymer is no greater than 6,000.

4. The composition according to claim 1, wherein a mass ratio of the second polymer to the first polymer is no less than 0.15 and no greater than 0.4.

5. The composition according to claim 1, wherein a content of the compound in the solvent is no less than 20% by mass and no greater than 50% by mass.

6. A pattern-forming method comprising:
applying the composition according to claim 1 on at least an upper face side of a substrate directly or via other layer to form a coating film;
carrying out phase separation of the coating film such that a plurality of phases of the coating film are formed;
removing a part of the plurality of phases of the coating film after the phase separation such that a resist pattern of the coating film is formed; and
etching the substrate using directly or indirectly the resist pattern as a mask.

7. The pattern-forming method according to claim 6, wherein a hole pattern is formed by the etching.

8. The composition according to claim 1, wherein the compound included in the solvent comprises a lactic acid alkyl ester.

9. The composition according to claim 1, wherein the terminal group included in the second polymer is represented by formula (1):

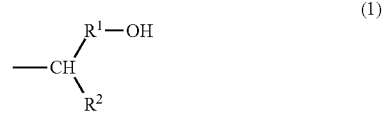

wherein in the above formula (1), $R^1$ represents a single bond or a divalent organic group having 1 to 30 carbon atoms; and $R^2$ represents a hydrogen atom or a monovalent organic group having 1 to 30 carbon atoms.

10. The composition according to claim 1, wherein a mass ratio of the second polymer to the first polymer is from 0.05 to 0.5.

11. The composition according to claim 1, wherein a mass ratio of the second polymer to the first polymer is from 0.2 to 0.3.

12. The pattern-forming method according to claim 6, wherein the compound included in the solvent comprises a lactic acid alkyl ester.

13. The pattern-forming method according to claim 6, wherein the terminal group included in the second polymer is represented by formula (1):

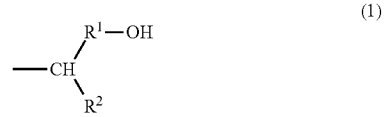

wherein in the above formula (1), $R^1$ represents a single bond or a divalent organic group having 1 to 30 carbon atoms; and R² represents a hydrogen atom or a monovalent organic group having 1 to 30 carbon atoms.

14. The pattern-forming method according to claim 8, wherein a mass ratio of the second polymer to the first polymer is from 0.05 to 0.5.

15. The pattern-forming method according to claim 8, wherein a mass ratio of the second polymer to the first polymer is from 0.2 to 0.3.

16. The composition according to claim 1, wherein the first polymer has a weight average molecular weight of from 30,000 to 150,000, and the second polymer has a weight average molecular weight of from 1,000 to 6,000.

17. The pattern-forming method according to claim 6, wherein the first polymer has a weight average molecular weight of from 30,000 to 150,000, and the second polymer has a weight average molecular weight of from 1,000 to 6,000.

18. The composition according to claim 16, wherein the first polymer has a number average molecular weight of 75,000 or more, and a ratio of the weight average molecular weight to the number average molecular weight is from 1.0 to 1.2.

19. The pattern-forming method according to claim 17, wherein the first polymer has a number average molecular weight of 75,000 or more, and a ratio of the weight average molecular weight to the number average molecular weight is from 1.0 to 1.2.

\* \* \* \* \*